(12) United States Patent
Gao et al.

(10) Patent No.: US 12,362,585 B2
(45) Date of Patent: Jul. 15, 2025

(54) METHOD AND SYSTEM FOR CHARGING A LITHIUM METAL BATTERY

(71) Applicant: GM GLOBAL TECHNOLOGY OPERATIONS LLC, Detroit, MI (US)

(72) Inventors: Jing Gao, Rochester, MI (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 614 days.

(21) Appl. No.: 17/747,528

(22) Filed: May 18, 2022

(65) Prior Publication Data
US 2023/0402866 A1    Dec. 14, 2023

(51) Int. Cl.
*H02J 7/00* (2006.01)
*G01R 31/378* (2019.01)
*G01R 31/3832* (2019.01)
*G01R 31/392* (2019.01)

(52) U.S. Cl.
CPC ........ *H02J 7/00718* (2020.01); *G01R 31/378* (2019.01); *G01R 31/3832* (2019.01); *G01R 31/392* (2019.01); *H02J 7/007188* (2020.01)

(58) Field of Classification Search
None
See application file for complete search history.

(56) References Cited

U.S. PATENT DOCUMENTS

2005/0194934 A1\* 9/2005 Iijima ................... H01M 4/505
                                                     320/128
2019/0356135 A1\* 11/2019 Kalam ...................... H02J 7/04

\* cited by examiner

*Primary Examiner* — Arun C Williams
(74) *Attorney, Agent, or Firm* — Quinn IP Law

(57) ABSTRACT

The concepts herein provide a method and associated system for charging a battery, such as a vehicle battery that is part of a propulsion system. The method includes determining a charging current profile for a lithium metal anode of the battery, determining an increasing current charging protocol based upon the charging current profile and charging the battery based upon the increasing current charging protocol.

20 Claims, 3 Drawing Sheets

METHOD AND SYSTEM FOR CHARGING A LITHIUM METAL BATTERY

INTRODUCTION

Lithium metal batteries may include one or multiple lithium ion battery cells that are electrically connected in parallel or in series, depending upon the needs of the system. Each battery cell includes one or a plurality of lithium ion electrode pairs that are enclosed within a sealed pouch envelope. In some embodiments, each electrode pair includes a negative electrode (anode) and a positive electrode (cathode), with a separator arranged therebetween. The separator functions to physically separate and electrically isolate the negative and positive electrodes, while permitting lithium ion transfer.

There is a desire to rapidly charge a lithium metal battery to improve customer acceptance of vehicles and other devices that may employ a lithium metal battery. However, rapid charging may result in permanent changes to elements of a lithium metal battery that reduce its charge capacity, and thus reduce travel range on-vehicle or usage times between charges. Such issues include, e.g., surface nucleation, lithium surface activation, plating layer consolidation, plating layer steady state growth, etc.

SUMMARY

There are benefits to having an electrical charging process for a lithium metal battery that facilitates rapid charging while understanding, accounting for, and minimizing undesired changes to elements of the lithium metal battery that reduce its charge capacity and its cycle life.

The concepts herein provide a method and associated system for charging a battery, such as a vehicle battery that is part of a propulsion system. The method includes determining a charging current profile for a lithium metal anode of the battery, determining an increasing current charging protocol based upon the charging current profile and charging the battery based upon the increasing current charging protocol.

An aspect of the disclosure includes a method for charging a battery that includes determining a charging current profile for a lithium metal anode of the battery; determining an increasing current charging protocol based upon the charging current profile; and charging the battery based upon the increasing current charging protocol.

Another aspect of the disclosure includes determining the charging current profile for the lithium metal anode of the battery by subjecting the lithium metal anode of the battery to a plurality of constant charging potentials in a stepwise manner, wherein the plurality of constant charging potentials range between a minimum potential and a maximum potential; monitoring a parameter of the lithium metal anode; determining a maximum constant charging potential based upon the parameter of the lithium metal anode; and determining the increasing current charging protocol based upon the maximum constant charging potential.

Another aspect of the disclosure includes the parameter of the lithium metal anode being related to one of surface nucleation, lithium surface activation, plating layer consolidation, or plating layer steady state growth.

Another aspect of the disclosure includes determining the maximum constant charging potential based upon the parameter of the lithium metal anode by selecting one of the plurality of constant charging potentials that minimizes degradation in the parameter of the lithium metal anode.

Another aspect of the disclosure includes determining the maximum constant charging potential based upon the parameter of the lithium metal anode by selecting one of the plurality of continuously increasing charging potentials that minimizes degradation in the parameter of the lithium metal anode.

Another aspect of the disclosure includes charging the battery based upon the increasing current charging protocol, including charging the battery with a controlled maximum permissible overpotential on the lithium metal anode that obviates a change in the parameter of the lithium metal anode.

Another aspect of the disclosure includes charging the battery based upon the increasing current charging protocol by charging the battery with a continuous increasing current charging protocol to the constant maximum permissible overpotential on the lithium metal anode.

Another aspect of the disclosure includes charging the battery based upon the increasing current charging protocol by charging the battery with a stepwise increasing current charging protocol to the constant maximum permissible overpotential on the lithium metal anode.

Another aspect of the disclosure includes a method for charging a battery that includes determining a charging current profile for a lithium metal anode of the battery; determining an increasing current charging protocol based upon the charging current profile, wherein the increasing current charging protocol includes a time-based maximum permissible overpotential on the lithium metal anode that obviates a change in the parameter of the lithium metal anode; and employing the increasing current charging protocol to rapidly charge the battery.

Another aspect of the disclosure includes determining the charging current profile for the lithium metal anode of the battery by subjecting the lithium metal anode of the battery to a plurality of constant charging potentials in a stepwise manner, wherein the plurality of constant charging potentials range between a minimum potential and a maximum potential; monitoring a parameter of the lithium metal anode; determining a maximum constant charging potential based upon the parameter of the lithium metal anode; and determining the increasing current charging protocol based upon the maximum constant charging potential.

Another aspect of the disclosure includes a system for electrically charging a lithium metal battery employing an electric power source that includes a charge controller having an increasing current charging protocol. The charge controller is electrically connected to the lithium metal battery, and is arranged to employ the increasing current charging protocol to control electric power flow between the electric power source and the lithium metal battery. The increasing current charging protocol includes a time-based maximum permissible overpotential on the lithium metal anode that obviates a change in the parameter of the lithium metal anode. The increasing current charging protocol includes algorithmic code, the algorithmic code being executable to rapidly charge the battery.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

The appended drawings are not necessarily to scale, and present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description to provide a thorough understanding of the embodiments disclosed herein, some embodiments can be practiced without some of these details. Moreover, for the purpose of clarity, certain technical material that is understood in the related art has not been described in detail to avoid unnecessarily obscuring the disclosure. Furthermore, the drawings are in simplified form and are not to precise scale. For purposes of convenience and clarity only, directional terms such as top, bottom, left, right, up, over, above, below, beneath, rear, and front, may be employed to assist in describing the drawings. These and similar directional terms are illustrative, and are not to be construed to limit the scope of the disclosure. Furthermore, the disclosure, as illustrated and described herein, may be practiced in the absence of an element that is not specifically disclosed herein.

Figure 1:
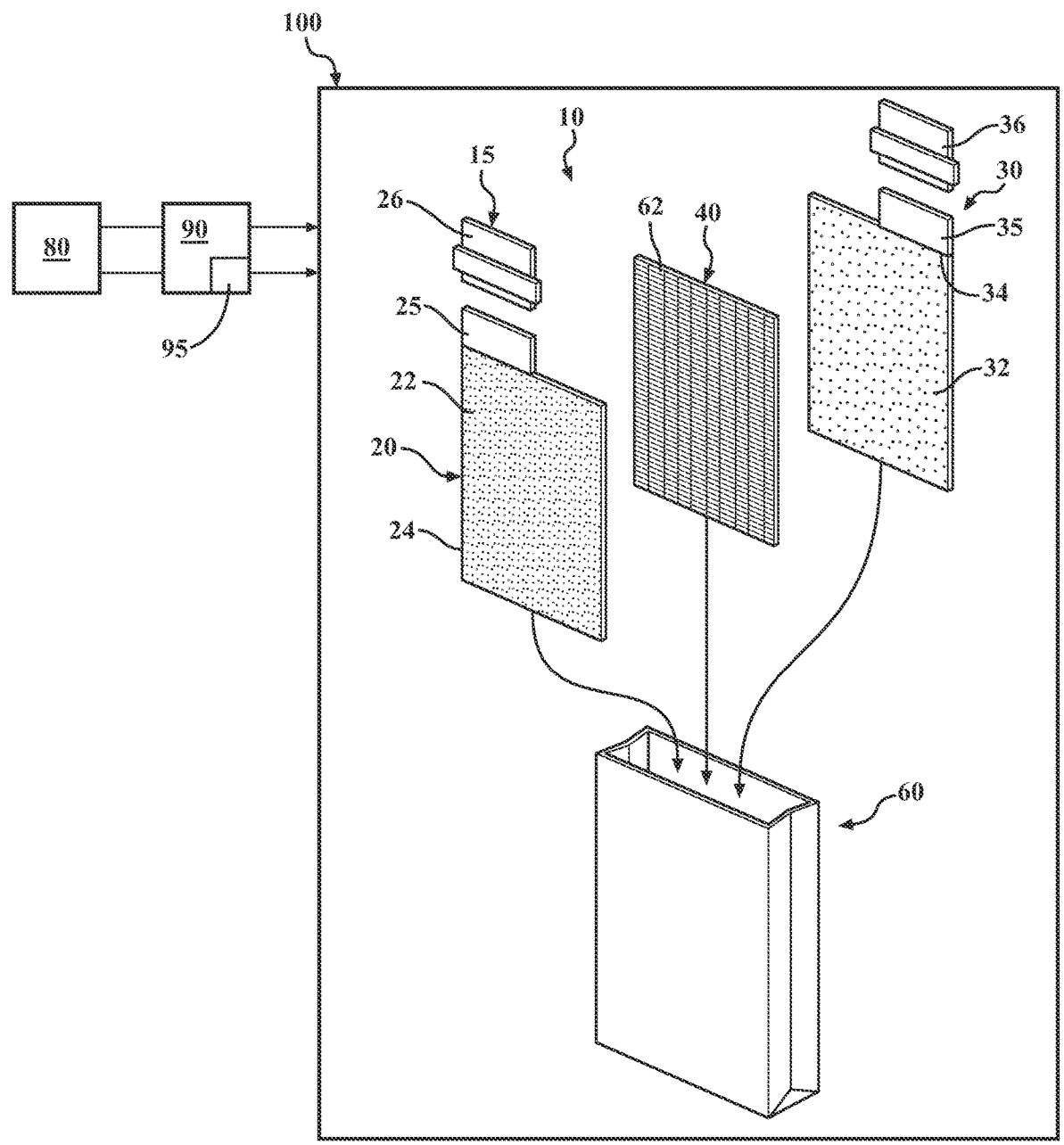
FIG. 1 schematically shows an exploded isometric view of a prismatic battery cell that includes an anode, a separator, and a cathode, in accordance with the disclosure.

Referring to the drawings, wherein like reference numerals correspond to like or similar components throughout the several Figures, FIG. 1 schematically illustrates a lithium metal battery 100 and associated charge controller 90. The charge controller 90 includes an increasing current charging protocol 95. The increasing current charging protocol 95 includes algorithmic code and calibration elements to control flow of electric power from an electric power source 80 to the lithium metal battery 100 to charge the lithium metal battery 100. The electric power source 80 is releasably connectable to the lithium metal battery 100 and the charge controller 90 via a plug device (not shown).

An embodiment of a single cell 10 for the lithium metal battery 100 is illustrated. The single cell 10 includes an electrode pair 15 having a lithium metal anode (anode) 20, a separator 40, a cathode 30, and an electrolytic material 62.

In one embodiment, and as illustrated, the lithium ion battery cell 10 is a prismatically-shaped lithium ion battery cell 10 that is arranged in a stack and sealed in a flexible pouch 60 containing an electrolytic material 62. Alternatively, the battery cell 10 may be arranged in a non-rectangular shape, a coiled configuration, a cylindrical configuration, or another configuration. In one embodiment, a reference electrode (not shown) may be arranged between the anode 20 and the cathode 30.

A first, negative battery cell tab 26 and a second, positive battery cell tab 36 protrude from the flexible pouch 60. The terms "anode" and "negative electrode" are used interchangeably. The terms "cathode" and "positive electrode" are used interchangeably. A single electrode pair 15 including an arrangement of the anode 20, separator 40, and cathode 30 is illustrated. It is appreciated that multiple electrode pairs 15 may be arranged and electrically connected in the flexible pouch 60, depending upon the specific application of the battery cell 10.

The anode 20 includes a first active material 22 that is arranged on an anode current collector 24. The anode current collector 24 is a metallic substrate with a foil portion 25 that extends from the first active material 22 to form the first battery cell tab 26.

The cathode 30 includes a second active material 32 that is arranged on a cathode current collector 34, with the cathode current collector 34 having a foil portion 35 that extends from the second active material 32 to form the second battery cell tab 36.

The anode and cathode current collectors 24, 34 are thin metallic plate-shaped elements that contact their respective first and second active materials 22, 32 over an appreciable interfacial surface area. The purpose of the anode and cathode current collectors 24, 34 is to exchange free electrons with their respective first and second active materials 22, 32 during discharging and charging.

The anode current collector 24 is a flat, plate-shaped metallic substrate in the form of a rectangular planar sheet in one embodiment. The anode current collector 24 is fabricated from one of copper, copper alloy, stainless steel, nickel, etc., or another material that does not alloy with lithium. In one embodiment, the anode current collector 24 has a thickness at or near 0.02 mm. The first active material 22 may be an indium nitride layer that is applied onto one or both surfaces of the anode current collector 24.

The cathode current collector 34 is a metallic substrate in the form of a planar sheet that is fabricated from aluminum or an aluminum alloy, and has a thickness at or near 0.02 mm in one embodiment. The separator 40 is arranged between the anode 20 and the cathode 30 to physically separate and electrically isolate the anode 20 from the cathode 30.

The electrolytic material 62 that conducts lithium ions is contained within the separator 40 and is exposed to each of the anode 20 and the cathode 30 to permit lithium ions to move between the anode 20 and the cathode 30. Lithium ions are stripped from the anode 20 during discharge, or from the cathode 30 during charge give up electrons that flow through the current collectors 24 and 34, respectively, through an external circuit connected either to a load or a charger, and then to the opposite current collectors (34 and 24) and electrodes (30 and 20) where they reduce lithium ions as they are being intercalated or plated.

The anode 20 and the cathode 30 are each fabricated as electrode materials that are able to deposit and strip the lithium ions (on an anode), or intercalate and de-intercalate (on a cathode). The electrode materials of the anode 20 and the cathode 30 are formulated to store lithium at different electrochemical potentials relative to a common reference electrode, e.g., lithium. In the construct of the electrode pair 15, the anode 20 stores deposited or plated lithium at a lower electrochemical potential (i.e., a higher energy state) than the cathode 30 such that an electrochemical potential difference exists between the anode 20 and the cathode 30 when the anode 20 is lithiated. The electrochemical potential difference for each battery cell 10 results in a charging voltage in the range of 3V to 5V and nominal open circuit voltage in the range of 2.9V to 4.2V. These attributes of the anode 20 and the cathode 30 permit the reversible transfer of lithium ions between the anode 20 and the cathode 30 either spontaneously (discharge phase) or through the application of an external voltage (charge phase) during operational cycling. The thickness of the anode 20 ranges between 10 microns (um) and 20 um in one embodiment.

The separator 40 may be composed as a porous ceramic coating layer or a porous polymer layer that, individually, may be composed of any of a wide variety of polymers that provide thermal stability. The polymer layer(s) function to electrically insulate and physically separate the anode 20 and the cathode 30. The separator 40 may further be infiltrated with the electrolytic material 62 throughout the porosity of the polymer layer(s). The electrolytic material 62, which also wets both the anode 20 and the cathode 30, preferably includes a lithium salt dissolved in a non-aqueous solvent. The separator 40 has a thickness that may be between 10 microns (um) to 50 um.

The concepts described herein provide a process, a system, and an apparatus for rapidly electrically charging an embodiment of the lithium metal battery 100 that is described with reference to FIG. 1 in a manner that prevents side reactions on the lithium metal anode 20, the electrolytic material 62, or the separator 40 that has contact with the metal anode 20 when it is potential-sensitive, wherein the side reactions may reduce a service life of the lithium metal battery 100. The process for electrically charging the lithium metal battery 100 is based upon a protocol that is developed from applying an overpotential on the lithium metal anode 20 of the lithium metal battery 100 during a charging event. This may include maintaining an overpotential with an increase current or current profile that includes increasing the current during the charging event while avoiding a magnitude of overpotential that may cause degradation of the lithium metal anode 20, the electrolytic material 62, or the separator 40. Applying the overpotential on the lithium metal anode 20 of the lithium metal battery 100 may include applying a continuous increasing current charging protocol during the charging event, as shown with reference to line 411 of FIG. 4. Alternatively, this may include applying a stepwise increasing current charging protocol during the charging event, as shown with reference to line 412 of FIG. 4.

The process for electrically charging the lithium metal battery 100 includes determining a charging current profile for a lithium metal anode of the battery, as described with reference to FIGS. 2 and 3, and determining the increasing current charging protocol based upon the charging current profile, as described with reference to FIG. 4. The charging event includes charging the battery based upon the increasing current charging protocol.

Figure 2:
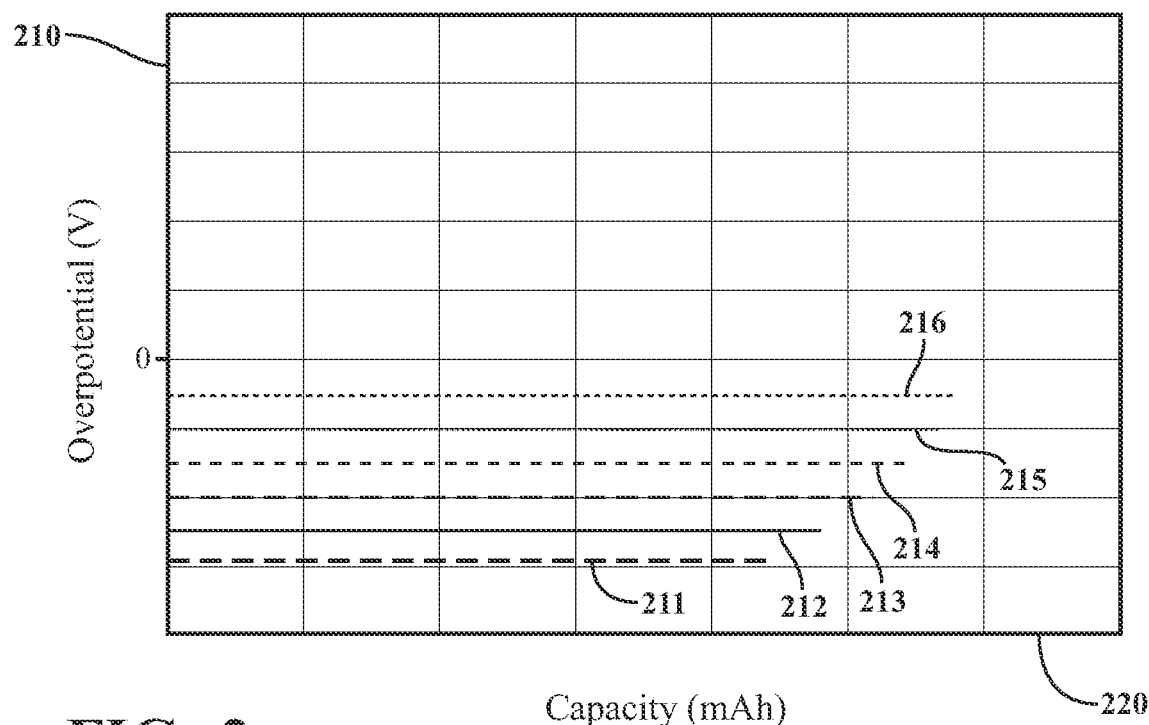
FIG. 2 graphically illustrates results associated with determining a charging current profile for a lithium metal anode of the battery, with a charging overpotential shown in relation to a plating capacity, in accordance with the disclosure.

FIG. 2 graphically illustrates an example of results associated with determining the charging current profile for the lithium metal anode for an embodiment of the battery 100 described with reference to FIG. 1. The vertical axis shows charging overpotential (V) 210 during charging of the lithium metal anode in relation to a plating capacity (mAh) 220, which is indicated on the horizontal axis. The plotted lines indicate results of charging at various levels of constant overpotential charging from a high charging overpotential (e.g., −60 mV vs Li/Li+ in Line 211) to a low charging overpotential (e.g., −10 mV bs Li/Li+ in Line 216), including a plurality of progressively increasing intermediate charging overpotentials indicated by Lines 212, 213, 214, 215, and 216. Line 216 illustrates a constant overcharging potential representing the slowest charge speed with the least degradation in the lithium metal anode 20, the separator 40, or the electrolytic material 62. Line 211 illustrates a constant overcharging potential representing the fast charge speed with the greatest degradation in the lithium metal anode 20, the separator 40, or the electrolytic material 62 for this arrangement.

The monitored battery parameter that may indicate a degradation in the lithium metal anode may be a parameter related to plating layer steady state growth. It is appreciated that similar results can be developed for surface nucleation, lithium surface activation, plating layer consolidation, or another parameter that indicates a physical or chemical change in the lithium metal anode 20, the electrolytic material 62, or the separator 40 that may reduce charge capacity or another parameter of the battery 100.

Figure 3:
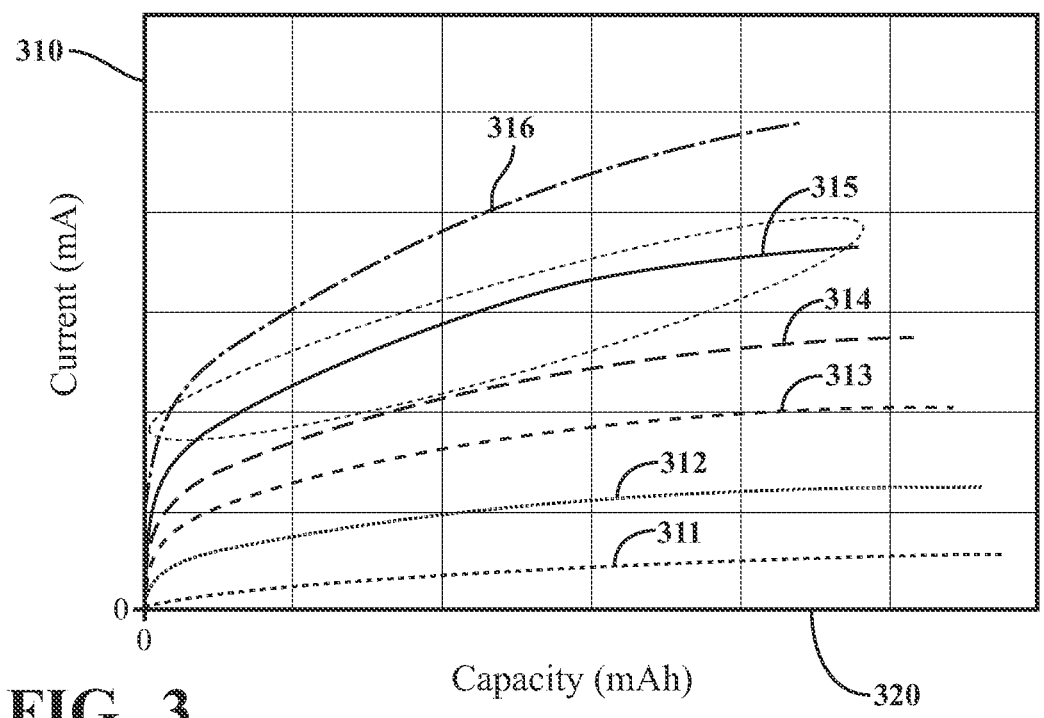
FIG. 3 graphically illustrates effects of plating current change under a constant overvoltage potential, in accordance with the disclosure.

FIG. 3 graphically illustrates an example of a plurality of charging current profiles and associated effects of plating current change under a constant overvoltage potential for an embodiment of the battery 100 described with reference to FIG. 1, with current (mA) 310 on the vertical axis and charge capacity (mAh) 320 on the horizontal axis. A plurality of constant potentials are illustrated, including −10 mV 311, −20 mV 312, −30 mV 313, −40 mV 314, −50 mV 315, and −60 mV 316. The charging current profiles correspond to the constant charging potentials depicted with reference to FIG. 2. The optimal charging current profile 315 is encircled, and represents the current from the maximum value for the constant charging potential (Line 216 of FIG. 2) that results in a lithium metal anode degradation that is within an allowable tolerance level in the lithium metal anode, the separator, or the electrolytic material of the battery cell while also providing a desired charge speed. The degradation of the lithium metal anode, the separator, or the electrolytic material can be assessed by parameters such as anode morphology change, dendrite growth possibility, or pre-calibrated capacity decay. The overpotential can also be selected based on a preference of the electrolytic material 62, the separator 40, or other components in the battery cell 10. For example, the overpotential may be determined by the stable voltage window to avoid a side reaction in the electrolytic material 62.

Figure 4:
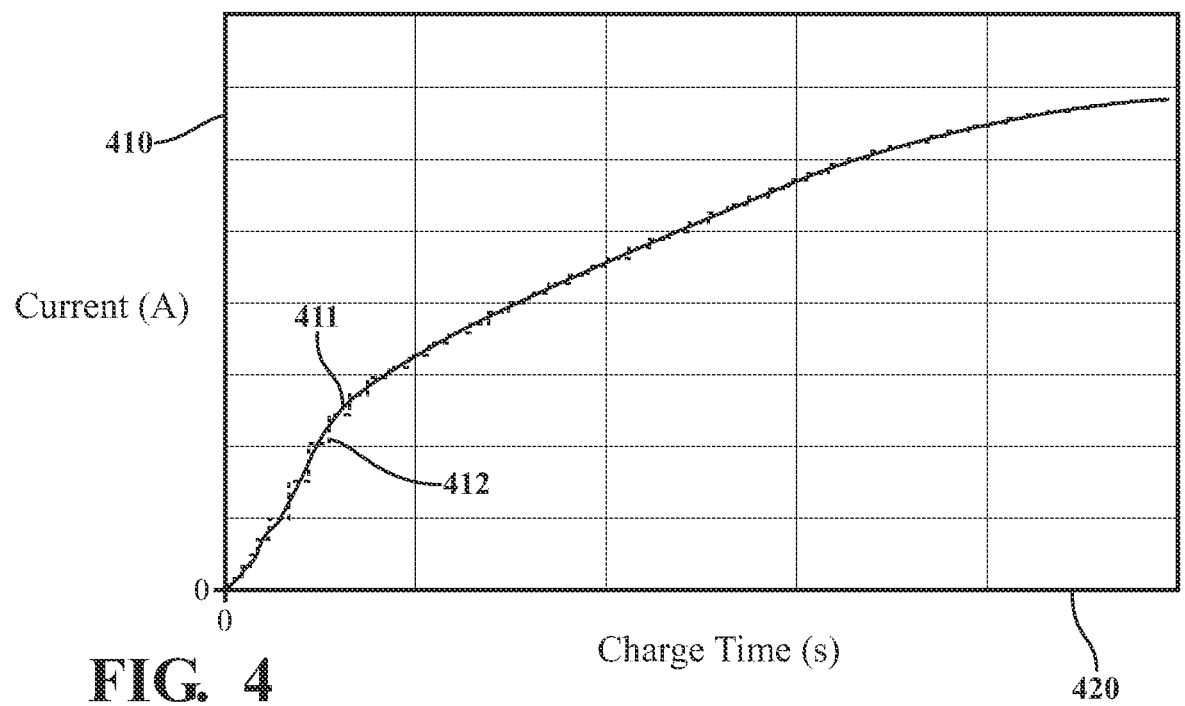
FIG. 4 graphically illustrates increasing current charging protocols that can be developed and implemented as algorithmic code and calibrations in a charge controller, in accordance with the disclosure.

FIG. 4 graphically illustrates an example of increasing current charging protocols that can be developed and implemented as algorithmic code and calibrations in the charge controller 90 described with reference to FIG. 1. The increasing current charging protocols are based upon a charging current profile for the lithium metal anode of the battery and a charging overpotential, examples of which are described with reference to FIG. 3. Charge current (A) 410 is shown on the vertical axis in relation to charge time (s) 420. A first increasing current charging protocol 411 is a scaled, continuously increasing charge protocol that ranges between a minimum potential and a maximum potential. A second, alternative increasing current charging protocol 412 is a scaled, stepwise increasing charge protocol that ranges between the minimum potential and the maximum potential and follows the first charging protocol 411, with incremental stepped changes in the current over time. The first charging protocol 411 provides for charging the battery 100 with an increasing current charging protocol and an increasing overpotential on the lithium metal anode 20. Alternatively, there may be another charging protocol that includes charging the battery 100 with an increasing current charging protocol and a decreasing overpotential on the lithium metal anode 20.

Alternatively, there can be a charging protocol that includes decreasing the overpotential during the charging event. The decreasing overpotential might be implemented at a later portion of a charge event by reducing the likelihood of dendrite growth when this risk is higher due to the anode morphology change.

Figure 5:
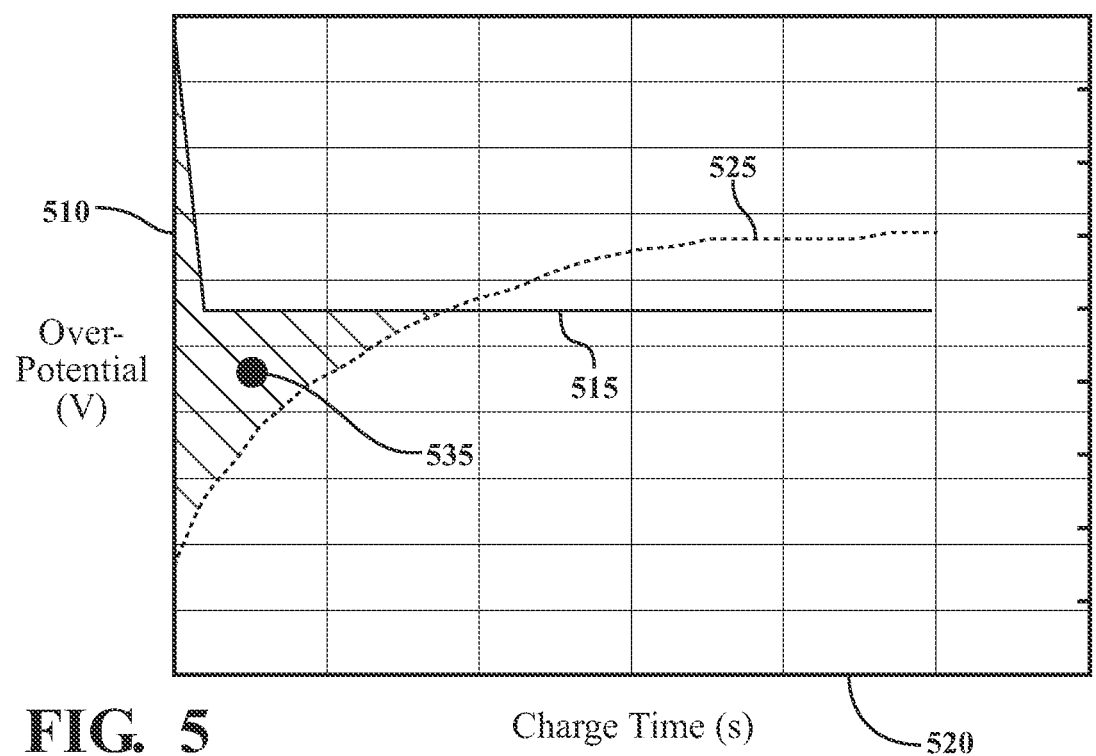
FIG. 5 graphically illustrates an example of an increasing current charging protocol, and a constant current charge protocol, shown in terms of an overpotential and charge time, in accordance with the disclosure.

FIG. 5 graphically illustrates an example of overpotential on a lithium metal anode 515 in relation to charge time 520, with an increasing current charging protocol 525, which can be developed and implemented in the charge controller 90 described with reference to FIG. 1. An overpotential on the lithium metal anode 515 is also shown in terms of the overpotential (V) 510 on the vertical axis and charge time (s) 520 on the horizontal axis, with the zero point being at the top of the vertical axis for overpotential (V) 510. The expected overpotential line 515 corresponds to the first increasing current charging protocol 411 that is described with reference to FIG. 4. The overpotential on the lithium metal anode 515 provides for a controlled maximum permissible overpotential on the lithium metal anode that obviates a change in the monitored parameter of the lithium metal anode. Line 525 corresponds to a constant current charging event with an equivalent average charge speed, for purposes of comparison. As shown with reference to line 515, the battery cell 10 is rapidly charged with a gradually increasing maximum permissible overpotential on the lithium metal anode 20 that obviates the change in the monitored parameter of the lithium metal anode. Alternatively, the battery is rapidly charged with the battery at a constant maximum permissible overpotential on the lithium metal anode overpotential that obviates the change in the monitored parameter of the lithium metal anode. Area 535 is highlighted, and represents a high overpotential when there is a risk of degradation in the lithium metal anode during a charging event due to magnitude of an overpotential that is excessive, which can be obviated by an increasing current charge with a controlled maximum permissible overpotential.

The concepts described herein provide for a battery charging protocol with an increasing current charging protocol that is determined by selective overpotential profile, and is customized to control the overpotential on the lithium metal anode. The increasing current charge protocol accounts for charge phases of surface nucleation, lithium surface activation, plating layer consolidation, and plating layer steady state growth that may affect performance of the lithium metal anode, the separator, or the electrolytic material. This charging protocol is customized to improve lithium metal anode cycle life by controlling the lithium metal morphology. This charging protocol is customized to reduce side reactions by preventing the electrode from reaching the overpotential that causes certain side reactions. The side reactions are prevented by preventing the anode from reaching overpotential levels that cause certain side reactions.

The terms controller, control module, module, control, control unit, processor and similar terms refer to one or various combinations of Application Specific Integrated Circuit(s) (ASIC), electronic circuit(s), central processing unit(s), e.g., microprocessor(s) and associated memory and storage devices (read only, programmable read only, random access, hard drive, etc.) executing one or more software or firmware programs or routines, combinational logic circuit(s), input/output circuit(s) and devices, signal conditioning and buffer circuitry and other components to provide a described functionality. Software, firmware, programs, instructions, control routines, code, algorithms and similar terms mean controller-executable instruction sets including calibrations and look-up tables. Each controller executes control routine(s) to provide desired functions, including monitoring inputs from sensing devices and other networked controllers and executing control and diagnostic routines to control operation of actuators. Routines may be executed at regular intervals, for example each 100 microseconds during ongoing operation. Communications between controllers and between controllers, actuators and/or sensors may be accomplished using a direct wired link, a networked communications bus link, a wireless link or another suitable communications link.

The terms "calibration", "calibrated", and related terms refer to a result or a process that correlates a desired parameter and one or multiple perceived or observed parameters for a device or a system. A calibration as described herein may be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can be a discrete value (e.g., either "1" or "0"), a percentage (e.g., 0% to 100%), or an infinitely variable value.

Moreover, words of approximation such as "about", "almost", "substantially", "generally", "approximately", "at or near", etc., may be used herein to mean within 0-5% of, within allowable manufacturing tolerances, or logical combinations thereof.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. Method for charging a battery, the method comprising:
   determining a charging current profile for a lithium metal anode of the battery;
   determining an increasing current charging protocol based upon the charging current profile, wherein the increasing current charging protocol includes incrementally changing the charging current over time during a charging event; and
   charging the battery based upon the increasing current charging protocol during the charging event.

2. The method of claim 1, wherein determining the charging current profile for the lithium metal anode of the battery comprises:
   subjecting the lithium metal anode of the battery to a plurality of continuously increasing charging potentials, wherein the plurality of continuously increasing charging potentials ranges between a minimum potential and a maximum potential;
   monitoring a parameter of the lithium metal anode;
   determining a maximum charging potential based upon the parameter of the lithium metal anode; and determining the increasing current charging protocol based upon the maximum constant charging potential.

3. The method of claim 2, wherein the parameter of the lithium metal anode is related to one of surface nucleation, lithium surface activation, plating layer consolidation, or plating layer steady state growth.

4. The method of claim 2, wherein determining the maximum constant charging potential based upon the parameter of the lithium metal anode comprises selecting one of the plurality of continuously increasing charging potentials that minimizes degradation in the parameter of the lithium metal anode.

5. The method of claim 2, comprising charging the battery based upon the increasing current charging protocol, including charging the battery with a controlled maximum permissible overpotential on the lithium metal anode that obviates a change in the parameter of the lithium metal anode.

6. The method of claim 5, wherein charging the battery based upon the increasing current charging protocol comprises charging the battery with an increasing current charging protocol and a decreasing overpotential on the lithium metal anode.

7. The method of claim 5, wherein charging the battery based upon the increasing current charging protocol comprises charging the battery with an increasing current charging protocol and an increasing overpotential on the lithium metal anode.

8. A method for charging a battery, the method comprising:
arranging the battery to include a lithium metal anode, a separator, and an electrolytic material;
determining a charging current profile for the lithium metal anode of the battery;
determining an increasing current charging protocol based upon the charging current profile, wherein the increasing current charging protocol includes incrementally changing the charging current over time during a charging event based upon a time-based maximum permissible overpotential on the lithium metal anode that obviates a change in a parameter of one of the lithium metal anode, the separator, or the electrolytic material; and
employing the increasing current charging protocol to rapidly charge the battery during the charging event.

9. The method of claim 8, wherein determining the charging current profile for the lithium metal anode of the battery comprises:
subjecting the lithium metal anode of the battery to a plurality of constant charging potentials, wherein the plurality of constant charging potentials range between a minimum potential and a maximum potential;
monitoring the parameter of one of the lithium metal anode, the separator, or the electrolytic material;
determining a maximum constant charging potential based upon the parameter of the lithium metal anode, the separator, or the electrolytic material; and
determining the increasing current charging protocol based upon the maximum constant charging potential.

10. The method of claim 9, wherein the parameter of the lithium metal anode, the separator, or the electrolytic material comprises one of surface nucleation, lithium surface activation, plating layer consolidation, or plating layer steady state growth.

11. The method of claim 9, wherein determining the maximum constant charging potential based upon the parameter of the lithium metal anode comprises selecting one of the plurality of constant charging potentials that minimizes degradation in the parameter of the lithium metal anode.

12. The method of claim 8, comprising employing the increasing current charging protocol to rapidly charge the battery by charging the battery with a controlled maximum permissible overpotential on the lithium metal anode that obviates a change in the parameter of one of the lithium metal anode, the separator, or the electrolytic material.

13. The method of claim 12, comprising charging the battery with the lithium metal anode with a continuous increasing current charging protocol to the maximum permissible overpotential on the lithium metal anode, wherein the maximum permissible overpotential on the lithium metal anode overpotential obviates the change in the parameter of one of the lithium metal anode, the separator, or the electrolytic material.

14. The method of claim 12, comprising charging the battery with the lithium metal anode with a stepwise increasing current charging protocol to the maximum permissible overpotential on the lithium metal anode, wherein the maximum permissible overpotential on the lithium metal anode obviates the change in the parameter of one of the lithium metal anode, the separator, or the electrolytic material.

15. A system for electrically charging a lithium metal battery employing an electric power source, comprising:
a charge controller including an increasing current charging protocol;
wherein the charge controller is electrically connected to the lithium metal battery;
wherein the charge controller is arranged to employ the increasing current charging protocol to control electric power flow between the electric power source and the lithium metal battery;
wherein the increasing current charging protocol includes incrementally changing the charging current over time during a charging event based upon a time-based maximum permissible overpotential on a lithium metal anode that obviates a change in the parameter of the lithium metal anode; and
wherein the increasing current charging protocol includes algorithmic code, the algorithmic code being executable to rapidly charge the lithium metal battery based upon the time-based maximum permissible overpotential on the lithium metal anode that obviates the change in the parameter of the lithium metal anode during the charging event.

16. The system of claim 15, further comprising determining the increasing current charging protocol, including:
determining a charging current profile for the lithium metal anode of the lithium metal battery; and
determining the increasing current charging protocol based upon the charging current profile, wherein the increasing current charging protocol includes the time-based maximum permissible overpotential on the lithium metal anode that obviates the change in the parameter of the lithium metal anode.

17. The system of claim 16, wherein determining the charging current profile for the lithium metal anode of the lithium metal battery comprises:
subjecting the lithium metal anode of the lithium metal battery to a plurality of constant charging potentials in a stepwise manner, wherein the plurality of constant charging potentials range between a minimum potential and a maximum potential;

monitoring a parameter of the lithium metal anode;
determining a maximum constant charging potential based upon the parameter of the lithium metal anode; and
determining the increasing current charging protocol based upon the maximum constant charging potential.

18. The system of claim 17, wherein the parameter of the lithium metal anode is related to one of surface nucleation, lithium surface activation, plating layer consolidation, or plating layer steady state growth.

19. The system of claim 17, wherein determining the maximum constant charging potential based upon the parameter of the lithium metal anode comprises selecting one of the plurality of constant charging potentials that minimizes degradation in the parameter of the lithium metal anode.

20. The system of claim 16, wherein the increasing current charging protocol comprises charging the lithium metal battery with the lithium metal anode at a continuously increasing current charging protocol to the maximum permissible overpotential on the lithium metal anode that obviates the change in the parameter of the lithium metal anode.

\* \* \* \* \*